US009991776B2

United States Patent
Roig-Guitart et al.

(10) Patent No.: US 9,991,776 B2
(45) Date of Patent: Jun. 5, 2018

(54) SWITCHED MODE POWER SUPPLY CONVERTER

(71) Applicant: SEMICONDUCTOR COMPONENTS INDUSTRIES, LLC, Phoenix, AZ (US)

(72) Inventors: Jaume Roig-Guitart, Oudenaarde (BE); Filip Bauwens, Loppem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 16 days.

(21) Appl. No.: 15/139,921

(22) Filed: Apr. 27, 2016

(65) Prior Publication Data

US 2017/0179825 A1 Jun. 22, 2017

Related U.S. Application Data

(60) Provisional application No. 62/268,289, filed on Dec. 16, 2015.

(51) Int. Cl.
*H02M 1/08* (2006.01)
*H02M 3/158* (2006.01)
(Continued)

(52) U.S. Cl.
CPC ............. *H02M 1/08* (2013.01); *H02M 3/158* (2013.01); *H03K 17/102* (2013.01);
(Continued)

(58) Field of Classification Search
CPC .......... H02M 1/32; H02M 1/08; H02M 3/158; H03K 17/6871; H03K 17/102; H03K 17/74; H03K 2217/0018; H03K 2017/6875
See application file for complete search history.

(56) References Cited

U.S. PATENT DOCUMENTS 7,180,762 B2   2/2007  Soldano
7,745,848 B1   6/2010  Rajagopal et al.
(Continued)

OTHER PUBLICATIONS

R. Chu et al., "High Performance GaN-on-Si Power Switch: Role of Substrate Bias in Device Characteristics," IEEE 69th Annual Device Research Conference (DRC), Jun. 2011, pp. 223-224.
(Continued)

*Primary Examiner* — Kyle J Moody
(74) *Attorney, Agent, or Firm* — Polansky & Associates, P.L.L.C.; Paul J. Polansky

(57) ABSTRACT

A method and apparatus for switched mode power supply (SMPS) system includes circuitry configured to produce a voltage output based on an input voltage, the SMPS circuitry includes inductive, capacitive and switching elements configured to generate the voltage output. The switching elements include at least one set of cascode coupled devices, each set of cascode coupled devices including a high electron mobility transistor (HEMT) and one of a diode and a field effect transistor (FET) in a cascode coupling. A controller produces a signal to a gate terminal of the FET of the sets of cascode coupled devices to drive the HEMT switching rate to adjust the output voltage. The circuitry of the SMPS further includes circuitry to couple the substrate of at least one HEMT to a high voltage node of the SMPS system to reduce large voltage spikes or dv/dts.

20 Claims, 5 Drawing Sheets

(51) Int. Cl.
  *H03K 17/10* (2006.01)
  *H03K 17/687* (2006.01)
  *H03K 17/74* (2006.01)
(52) U.S. Cl.
  CPC ......... *H03K 17/6871* (2013.01); *H03K 17/74* (2013.01); *H03K 2017/6875* (2013.01); *H03K 2217/0018* (2013.01)

(56) References Cited

U.S. PATENT DOCUMENTS

| | | | |
|---|---|---|---|
| 7,888,713 | B2 | 2/2011 | Kawasaki |
| 8,084,783 | B2 | 12/2011 | Zhang |
| 8,455,931 | B2 | 6/2013 | Wu |
| 9,547,320 | B2* | 1/2017 | Imada .................. H02M 3/24 |
| 2004/0130002 | A1 | 7/2004 | Weeks et al. |
| 2006/0261473 | A1 | 11/2006 | Connah et al. |
| 2008/0180083 | A1 | 7/2008 | Briere et al. |
| 2009/0278513 | A1 | 11/2009 | Bahramian et al. |
| 2011/0080156 | A1 | 4/2011 | Briere et al. |
| 2011/0169549 | A1 | 7/2011 | Wu |
| 2011/0193619 | A1 | 8/2011 | Parikh et al. |
| 2011/0304311 | A1 | 12/2011 | Takahashi et al. |
| 2012/0074920 | A1 | 3/2012 | Callanan |
| 2012/0211800 | A1 | 8/2012 | Boutros |
| 2012/0223321 | A1 | 9/2012 | Lin et al. |
| 2012/0256188 | A1 | 10/2012 | McDonald et al. |
| 2013/0187627 | A1* | 7/2013 | Imada .................. H01L 27/088 323/311 |
| 2015/0048420 | A1* | 2/2015 | Leomant ............. H01L 29/4175 257/194 |
| 2015/0084530 | A1* | 3/2015 | Kitamura ................ H02M 7/06 315/200 R |
| 2016/0072386 | A1* | 3/2016 | Saito ..................... H02M 3/158 323/271 |
| 2016/0322969 | A1* | 11/2016 | Padmanabhan ....... H01L 29/747 |
| 2016/0380531 | A1* | 12/2016 | Kataoka ............. H02M 1/4225 323/210 |

OTHER PUBLICATIONS

A. Vazquez et al., "On the Use of Front-End Cascode Rectifiers Based on Normally-on SIC JFET and Si MOSFET," IEEE 28th Annual Applied Power Electronics Conference and Exposition (APEC), Mar. 2013, pp. 1844-1851.

R. Siemieniec et al., "The 1200V direct-driven SiC JFET power switch," IEEE Proceedings of the 2011-14th European Conference on Power Electronics and Applications (EPE 2011), Aug. 30 to Sep. 1, 2011, pp. 1-10.

D. Domes et al., "Cascode Light—normally-on JFET stand alone performance in a normally-off Cascode circuit," PCIM Europe 2010, May 2010, pp. 286-290.

D. Aggeler et al., "Dv/Dt-Control Methods for the SiC JFET/Si MOSFET Cascode," IEEE Transactions on Power Electronics, vol. 28, No. 8, Aug. 2013, pp. 4074-4082.

D. Aggeler et al., "Controllable dv/dt Behaviour of the SiC MOSFET/JFET Cascode An Alternative Hard Commutated Switch for Telecom Applications," 25th Annual IEEE Applied Power Electronics Conference and Exposition (APEC), Feb. 2010, pp. 1584-1590.

W. Zhang et al., "Gate Drive Design Considerations for High Voltage Cascode GaN HEMT," 29th Annual IEEE Applied Power Electronics Conference and Exposition (APEC), Mar. 2014, pp. 1484-1489.

* cited by examiner

SWITCHED MODE POWER SUPPLY CONVERTER

CROSS-REFERENCE TO RELATED APPLICATION(S)

This application claims priority to U.S. Provisional Application No. 62/268,289, filed on Dec. 16, 2015, entitled "Switched Mode Power Supply Converter," invented by Jaume Roig-Guitart and Filip Bauwens, and is incorporated herein by reference and priority thereto for common subject matter is hereby claimed.

FIELD OF THE DISCLOSURE

The present disclosure relates generally to voltage supply circuits and, more particularly, to voltage supply circuits and systems that utilize High Electron Mobility Transistors (HEMTs).

BACKGROUND

Power or voltage converter circuits are used to convert a voltage source to from one type of power (e.g., alternating current (AC) or direct current (DC)). Such AC source may include a generator or electrical power grid power source. Such a DC source may include a battery or DC power supply. Other types of power converter circuits include circuits that merely change the voltage level. For example, a DC voltage level may desirably be increased or decreased according to the needs of the load device. Generally, a power converter circuit provides an output voltage that has a different level than the input voltage.

Direct Current to Direct Current (DC to DC) circuits are a common type of power converter. DC to DC power converters storing input energy from a power source and then releasing that energy to an output load at a different voltage level, typically at a high frequency. DC to DC converter circuits are generally more power efficient than linear voltage regulators because they dissipate less power as heat. It is generally desirable to operate switched mode power converter circuits at higher frequencies as the component size and weight of such circuits can be reduced by, for example, eliminating low frequency transformers.

In recent years, with advance in power of high-frequency semiconductor element, high frequency characteristics and reliability in a field effect transistor (FET) are often used in such power converters. In particular, GaN-based semiconductors that contain GaN as a principal constituent are often being used because of its high saturation electron velocity and high voltage breakdown characteristics.

GaN-based switching devices, such as hetero-junction field effect transistors (FETs), are advantageous over other types of conventional FET solutions in that they posses higher power densities, higher breakdown voltages and lower on-resistances. GaN FETs are typically formed as normally ON depletion mode devices. For certain applications, such as power applications, normally ON devices can be less desirable than normally OFF devices such as standard FET devices because normally ON devices are often operated less efficiently than normally OFF devices and the drive circuitry for normally ON devices has conventionally been more complicated and expensive than normally OFF devices. Thus, it is known to configure a depletion mode GaN FET in a cascode configuration with a silicon FET (Si-FET) to improve efficiency.

GaN-HEMT/Si-FET cascode devices may be utilized in such power converter circuits but they are problematic because they often have a large voltage spikes or rapidly changing voltage levels (dv/dt). For example, the rate of change for the voltage can exceed 100V/ns. Control by common techniques is often found to be difficult in some applications. Large dv/dt is a problem in synchronous DC/DC converters, for example, because of EMI issues and driver incompatibility. In some circuits, a desired maximum voltage rate of change is 50V/ns. Accordingly, because of the advantages of GaN-HEMT/Si-FET cascode devices in high voltage high power converters, a need exists for reducing the large voltage spikes (dv/dt) resulting from high current levels flowing into the circuit capacitors and associated problems that may be experienced.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
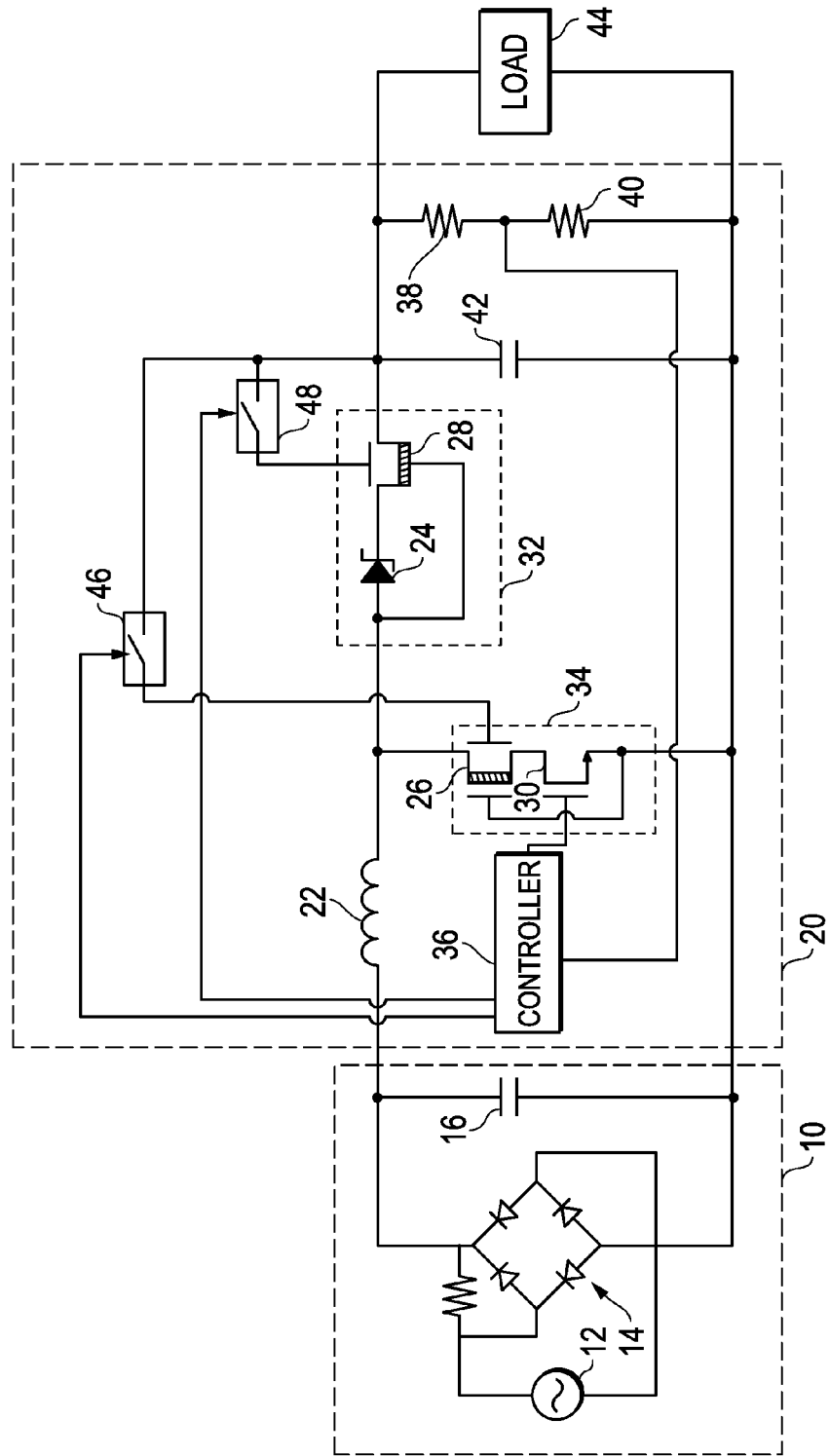
FIG. 1 is a partial schematic and partial block diagram of a power converter according to one embodiment.

FIG. 1 is a partial schematic and partial block diagram of a power converter according to one embodiment. A switched mode power supply (SMPS) circuit system includes a power source 10 that further includes an alternating current (AC) voltage generator 12 that is connected to deliver an AC voltage signal to a pair of inputs of a full wave rectifier shown at 14. The full wave rectifier produces a full wave rectified output at a pair of output nodes. A capacitor 16 is connected across the pair of output nodes of the full wave rectifier 14. Accordingly, a rectified and filtered direct current (DC) voltage signal appears across the pair of output nodes of the full wave rectifier 14. These output nodes are also the output nodes of power source 10.

The output of power source 10 is produced to a DC-DC converter 20. A first output node of power source 10 is connected to an inductor 22 that, in turn, is connected to a high voltage Schottky diode 24 and to a HEMT 26. Schottky diode 24 is, in turn, connected to a HEMT 28. HEMT 26 is further connected to a drain terminal of a FET 30. A source terminal of FET 30 is connected to ground or circuit common. Here, ground or circuit common also is connected to a second output node of power source 10.

A gate terminal of HEMT 28 is connected to the input terminal of Schottky diode 24 that is also connected to inductor 22. A gate terminal of HEMT 26 is connected to the source terminal of FET 30 that is also connected to ground or circuit common. HEMTs 26 and 28 are connected in a cascode configuration. HEMT 28 and Schottky diode 24 form first cascode coupled devices 32 and HEMT 26 and FET 30 form second cascode coupled devices 34.

A controller is connected to a gate terminal of FET 30 to selectively activate FET 30. An output terminal of GaN HEMT 28 is connected to a first resistor 38 that is connected in series to a second resistor 40. The second resistor 40 is connected to ground or circuit common. Controller 36 is further connected to a node that connects the resistors 38 and 40 to sense a voltage across resistor 40. A node connecting the output of HEMT 28 and resistor 38 is an output node of DC-DC converter 20 and is further connected a capacitor 42 and to a load 44. Capacitor 42 is also connected to ground or circuit common and serves to filter the output voltage produced to load 44. Load 44 is also connected to ground or circuit common and to a second output node of DC-DC converter 20.

One aspect of the system of FIG. 1 is that the DC-DC converter 20 typically produces a high voltage output to load 42. The system of FIG. 1 further includes switching circuitry to selectively couple a substrate of HEMTs 26 and 28 to the high voltage output to improve circuit performance by reducing dv/dt. More specifically, a substrate of HEMT 26 is connected to a switch 46 that is further connected to the output node of the DC-DC converter 20. Switch 46 is further connected to receive control signals from controller 36 to activate the switch to selectively connect the substrate of HEMT 26 to the high voltage output.

Similarly, a substrate of GaN HEMT 28 is connected to a switch 48 that, in turn, is also connected to the high voltage output of DC-DC converter 20. Switch 48, in the described embodiment, is also connected to receive control signals from controller 36 to activate the switch to selectively couple the substrate of HEMT 28 to the high voltage output. Here, each of the switches 46 and 48 receives a separate control signal. Alternatively, they could receive the same control signal. Having different control signals allows controller 36 to selectively couple the HEMT substrates independently. It should be understood that the switches 46 and 48 connect the substrates to the output because the high voltage of this circuit configuration is at the output. In a different configuration wherein the high voltage output is presented at a different node, the switches would be connected to that node carrying the high voltage. For example, if the DC-DC converter is configured to reduce a high voltage to a lower voltage and is connected to receive a high voltage, the switches would be connected to the input of the circuit to selectively couple the substrates of HEMT FETs 26 and 28 to the input of the DC-DC converter.

In operation, power source 10 produces a DC voltage having a first magnitude or voltage level to DC-DC converter 20 based on a received input voltage. DC-DC converter 20, by switching devices 28 and 30 on and off at a high frequency rate, causes the output voltage produced to load 42 to be increased (or decreased in an alternative embodiment). For example, the input voltage can range from 12V to 1.7 kV and the output voltage can range from 12V to 1.7 kV. The high voltage node to which the HEMT FET substrate is connected comprises either the input for a step down converter or the output for a step up converter. In the described embodiment, the SMPS system receives a relatively low DC voltage from voltage source 10 and produces a 400 V DC voltage at the output.

Controller 36 samples a voltage across resistor 40 in a feedback loop to determine whether to adjust the frequency rate of the switching and the on duration rate vs. the off duration rate to adjust the output voltage level. Additionally, controller 36 generates control signals to open and close switches 46 and 48 to selectively connect the substrates of HEMTs 26 and 28 to the high voltage output to reduce dv/dt. Generally, a high voltage bias of the substrate helps reduce the voltage spikes within the circuit. While FIG. 1 illustrates two HEMT FETs having substrates that are selectively connected to the high voltage output, in an alternative design, only one substrate would be configured to be connected to the high voltage output. Controller 36 is operable to connect the substrate to the high voltage node during a portion of a duty cycle, when the HEMT FET is conducting current, when large dv/dts are detected (exceeding a threshold), or when the HEMT FET is turning off or on.

Figure 2:
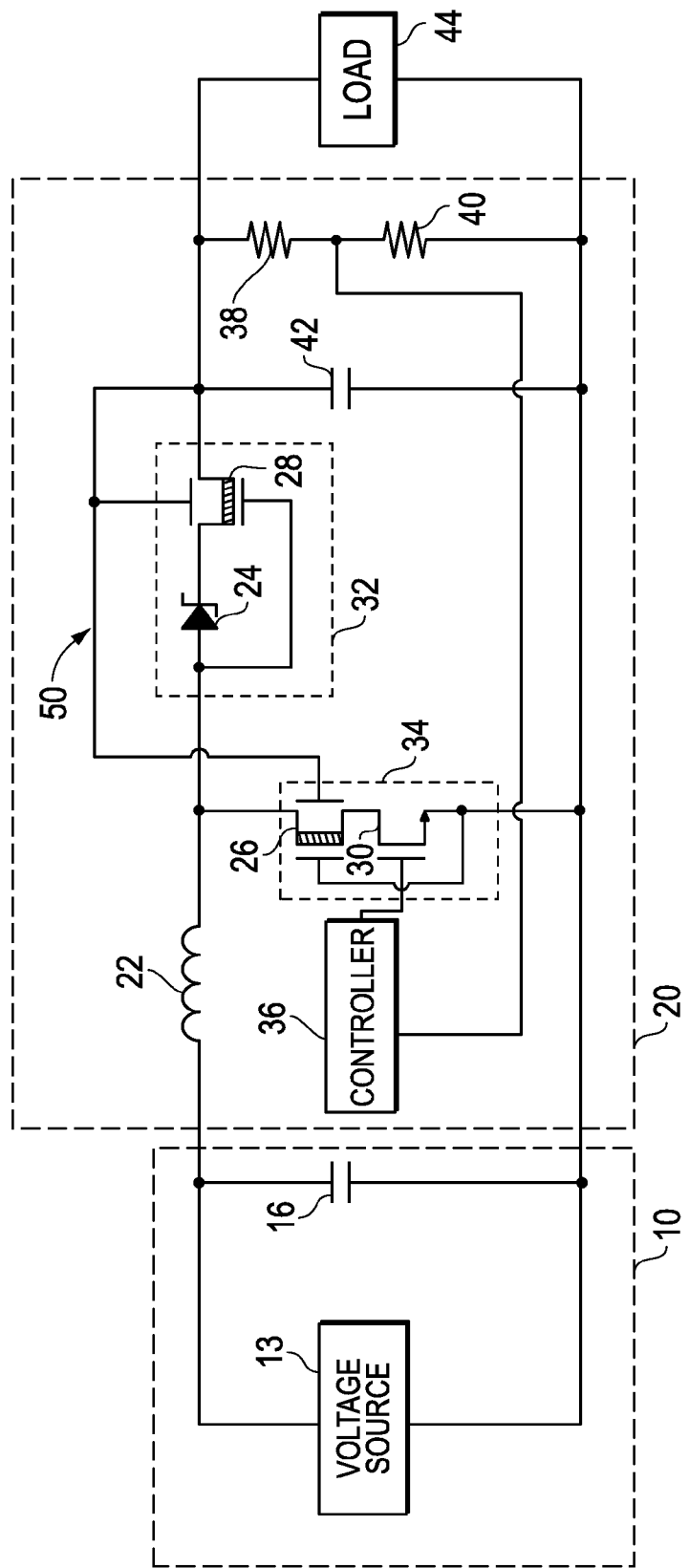
FIG. 2 is a partial schematic and partial block diagram of a power converter according to one embodiment in which HEMT substrates are continuously connected to a high voltage output.

FIG. 2 is a partial schematic and partial block diagram of a power converter according to one embodiment in which HEMT substrates are continuously connected to a high voltage output. A power source 10 includes voltage generator 13 that is connected to deliver a voltage signal to a capacitor 16 is connected across the pair of output nodes. This embodiment may be similar or different from that of FIG. 1.

The output of power source 10 is produced to a DC-DC converter 20. A first output of power source 10 is connected to an inductor 22 that, in turn is connected to a high voltage Schottky diode 24 and a HEMT 26. Schottky diode 24 is, in turn, connected to a HEMT 28 while HEMT 26 is further connected to conduct current to a drain terminal of FET 30 which is connected to conduct current from a source terminal to ground or circuit common. Here, ground or circuit common also is connected to a second output of power source 10. A gate terminal of HEMT 28 is connected to the input terminal of Schottky diode 24 that is also connected to inductor 22. A gate terminal of HEMT 26 is connected to the source terminal of FET 30 that is also connected to ground or circuit common. HEMTs 26 and 28 are connected as cascode devices. HEMT 28 and Schottky diode 24 form first cascode coupled devices 32 and HEMT 26 and FET 30 form second cascode coupled devices 34.

A controller is connected to a gate terminal of FET 30 to selectively activate FET 30. An output terminal of GaN HEMT 28 is connected to a first resistor 38 that is connected in series to a second resistor 40. The second resistor 40 is connected to ground or circuit common. Controller 36 is further connected to a node that connects the resistors 38 and 40 to sense a voltage across resistor 40. A node connecting the output of HEMT 28 and resistor 38 is an output node of DC-DC converter 20 and is further connected a capacitor 42 and to a load 44. Capacitor 42 is also connected to ground or circuit common and serves to filter the output voltage produced to load 44. Load 44 is also connected to ground or circuit common and to a second output node of DC-DC converter 20.

One aspect of the system of FIG. 2 is that the DC-DC converter 20 typically produces a high voltage output to load 42. The system of FIG. 2 further includes circuitry to connect a substrate of the HEMTs 26 and 28 to the high voltage output to improve circuit performance. More specifically, a substrate of HEMT 26 is connected to a line 50 that is further connected to the output node of the DC-DC converter 20 that produces a high voltage output. Similarly, a substrate of GaN HEMT 28 is connected to line 50 that is connected to the high voltage output of DC-DC converter 20.

In operation, power source 10 produces a DC voltage having a first magnitude or voltage level to DC-DC converter 20. DC-DC converter 20, by switching devices 28 and 30 on and off at a high frequency rate, causes the output voltage produced to load 42 to be increased. Controller 36 samples a voltage across resistor 40 in a feedback loop to determine whether to adjust the frequency rate of the switching and the on duration rate vs. the off duration rate to adjust the output voltage level. Line 50 connects the substrates of HEMTs 26 and 28 to the high voltage output to reduce dv/dt at all times.

Figure 3:
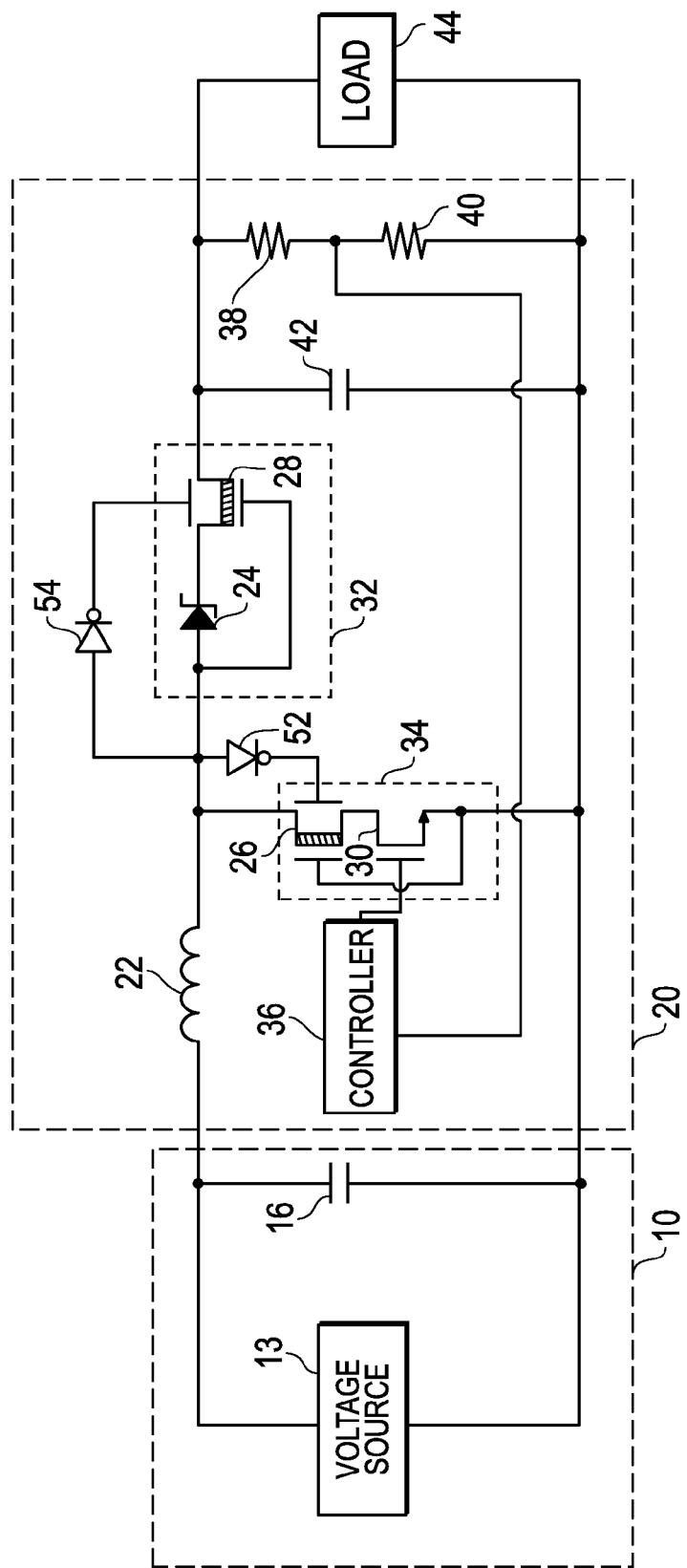
FIG. 3 is a partial schematic and partial block diagram of a power converter according to one embodiment in which HEMT substrates are connected to a high voltage output during a duty cycle portion.

FIG. 3 is a partial schematic and partial block diagram of a power converter according to one embodiment in which HEMT substrates are connected to a high voltage output during a duty cycle portion. A power source 10 includes voltage generator 13 that is connected to deliver a voltage signal to a capacitor 16 is connected across the pair of output nodes. This embodiment may be similar or different from that of FIG. 1.

The output of power source 10 is produced to a DC-DC converter 20. A first output of power source 10 is connected to an inductor 22 that, in turn is connected to a high voltage Schottky diode 24 and a HEMT 26. Schottky diode 24 is, in turn, connected to a HEMT 28 while HEMT 26 is further connected to conduct current to a drain terminal of FET 30 which is connected to conduct current from a source terminal to ground or circuit common. Here, ground or circuit common also is connected to a second output of power source 10. A gate terminal of HEMT 28 is connected to the input terminal of Schottky diode 24 that is also connected to inductor 22. A gate terminal of HEMT 26 is connected to the source terminal of FET 30 that is also connected to ground or circuit common. HEMTs 26 and 28 are connected as cascode devices. HEMT 28 and Schottky diode 24 form first cascode coupled devices 32 and HEMT 26 and FET 30 form second cascode coupled devices 34.

A controller is connected to a gate terminal of FET 30 to selectively activate FET 30. An output terminal of GaN HEMT 28 is connected to a first resistor 38 that is connected in series to a second resistor 40. The second resistor 40 is connected to ground or circuit common. Controller 36 is further connected to a node that connects the resistors 38 and 40 to sense a voltage across resistor 40. A node connecting the output of HEMT 28 and resistor 38 is an output node of DC-DC converter 20 and is further connected a capacitor 42 and to a load 44. Capacitor 42 is also connected to ground or circuit common and serves to filter the output voltage produced to load 44. Load 44 is also connected to ground or circuit common and to a second output node of DC-DC converter 20.

One aspect of the system of FIG. 3 is that the DC-DC converter 20 typically produces a high voltage output to load 42. The system of FIG. 3 further includes circuitry to connect a substrate of the HEMTs 26 and 28 to a high voltage input to first cascode coupled devices 32 to improve circuit performance. More specifically, a substrate of HEMT 26 is connected to an inverter 52 that is further connected to the input node of the first cascode coupled devices 32. Similarly, a substrate of GaN HEMT 28 is connected to an inverter 54 that is further connected to the input node of the first cascode coupled devices 32.

In operation, power source 10 produces a DC voltage having a first magnitude or voltage level to DC-DC converter 20. DC-DC converter 20, by switching devices 28 and 30 on and off at a high frequency rate, causes the output voltage produced to load 42 to be increased as well as the input voltage to the input node of the first cascode coupled devices 32. Controller 36 samples a voltage across resistor 40 in a feedback loop to determine whether to adjust the frequency rate of the switching and the on duration rate vs. the off duration rate to adjust the output voltage level. Line 50 connects the substrates of HEMTs 26 and 28 to the high voltage to reduce dv/dt during either D or 1-D (a portion of the duty cycle).

Figure 4:
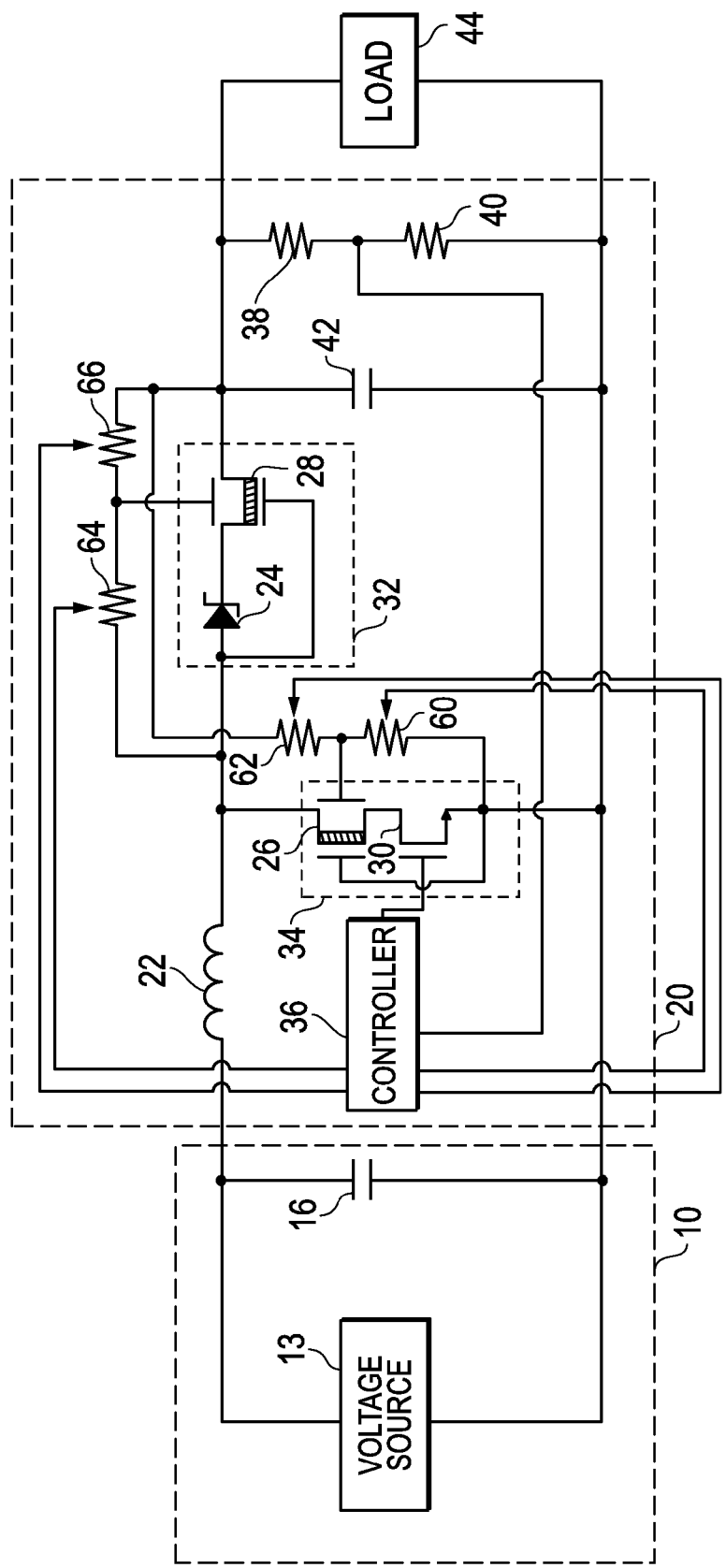
FIG. 4 is a partial schematic and partial block diagram of a power converter according to one embodiment in which HEMT substrates are connected to a high voltage output during a duty cycle portion.

FIG. 4 is a partial schematic and partial block diagram of a power converter according to one embodiment in which HEMT substrates are connected to a high voltage output during a duty cycle portion. A power source 10 includes voltage generator 13 that is connected to deliver a voltage signal to a capacitor 16 is connected across the pair of output nodes. This embodiment may be similar or different from that of FIG. 1.

The output of power source 10 is produced to a DC-DC converter 20. A first output of power source 10 is connected to an inductor 22 that, in turn is connected to a high voltage Schottky diode 24 and a HEMT 26. Schottky diode 24 is, in turn, connected to a HEMT 28 while HEMT 26 is further connected to conduct current to a drain terminal of FET 30 which is connected to conduct current from a source terminal to ground or circuit common. Here, ground or circuit common also is connected to a second output of power source 10. A gate terminal of HEMT 28 is connected to the input terminal of Schottky diode 24 that is also connected to inductor 22. A gate terminal of HEMT 26 is connected to the source terminal of FET 30 that is also connected to ground or circuit common. HEMTs 26 and 28 are connected as cascode devices. HEMT 28 and Schottky diode 24 form first cascode coupled devices 32 and HEMT 26 and FET 30 form second cascode coupled devices 34.

A controller is connected to a gate terminal of FET 30 to selectively activate FET 30. An output terminal of GaN HEMT 28 is connected to a first resistor 38 that is connected in series to a second resistor 40. The second resistor 40 is connected to ground or circuit common. Controller 36 is further connected to a node that connects the resistors 38 and 40 to sense a voltage across resistor 40. A node connecting the output of HEMT 28 and resistor 38 is an output node of DC-DC converter 20 and is further connected a capacitor 42 and to a load 44. Capacitor 42 is also connected to ground or circuit common and serves to filter the output voltage produced to load 44. Load 44 is also connected to ground or circuit common and to a second output node of DC-DC converter 20.

One aspect of the system of FIG. 4 is that the DC-DC converter 20 typically produces a high voltage output to load 42. The system of FIG. 4 further includes voltage divider circuitry to connect a substrate of the HEMTs 26 and 28 to a divided voltage between a high voltage input to first cascode coupled devices 32 and a high voltage output to improve circuit performance. More specifically, two series coupled resistors 60 and 62 are jointly connected across the high voltage output and ground or circuit common. A substrate of HEMT 26 is connected to a node between resistors 60 and 62. Similarly, two series coupled resistors 64 and 66 are jointly connected across the high voltage output and the input terminal of Schottky diode 24 that is also connected to inductor 22. A substrate of GaN HEMT 28 is connected to a node between resistors 64 and 66.

In one embodiment, resistors 60-66 are standard resistive elements or resistors that are not adjustable. In an alternative embodiment, at least one resistor of resistors 60 and 62, and at least one resistor of resistor 64 and 66 is adjustable. Accordingly, in this embodiment, controller 36 is connected to adjust the adjustable resistors of resistors 60-66. In the embodiment shown, all four resistors 60-66 are adjustable. Accordingly, the controller 36 is operable to adjust the voltage and the node between the resistors to adjust the bias voltage of the substrate. In one embodiment, the adjustable resistors each comprise a resistor ladder whose elements are selectable to adjust the resistance. Other configurations for adjusting resistance may also be used.

In operation, power source 10 produces a DC voltage having a first magnitude or voltage level to DC-DC converter 20. DC-DC converter 20, by switching devices 28 and 30 on and off at a high frequency rate, causes the output voltage produced to load 42 to be increased as well as the input voltage to the input node of the first cascode coupled devices 32. Controller 36 samples a voltage across resistor 40 in a feedback loop to determine whether to adjust the frequency rate of the switching and the on duration rate vs. the off duration rate to adjust the output voltage level. Controller 36 generates resistor adjustment signals to the adjustable resistors to adjust the bias voltage applied to the substrates of HEMTs 26 and 28 to the high voltage to reduce dv/dt.

Figure 5:
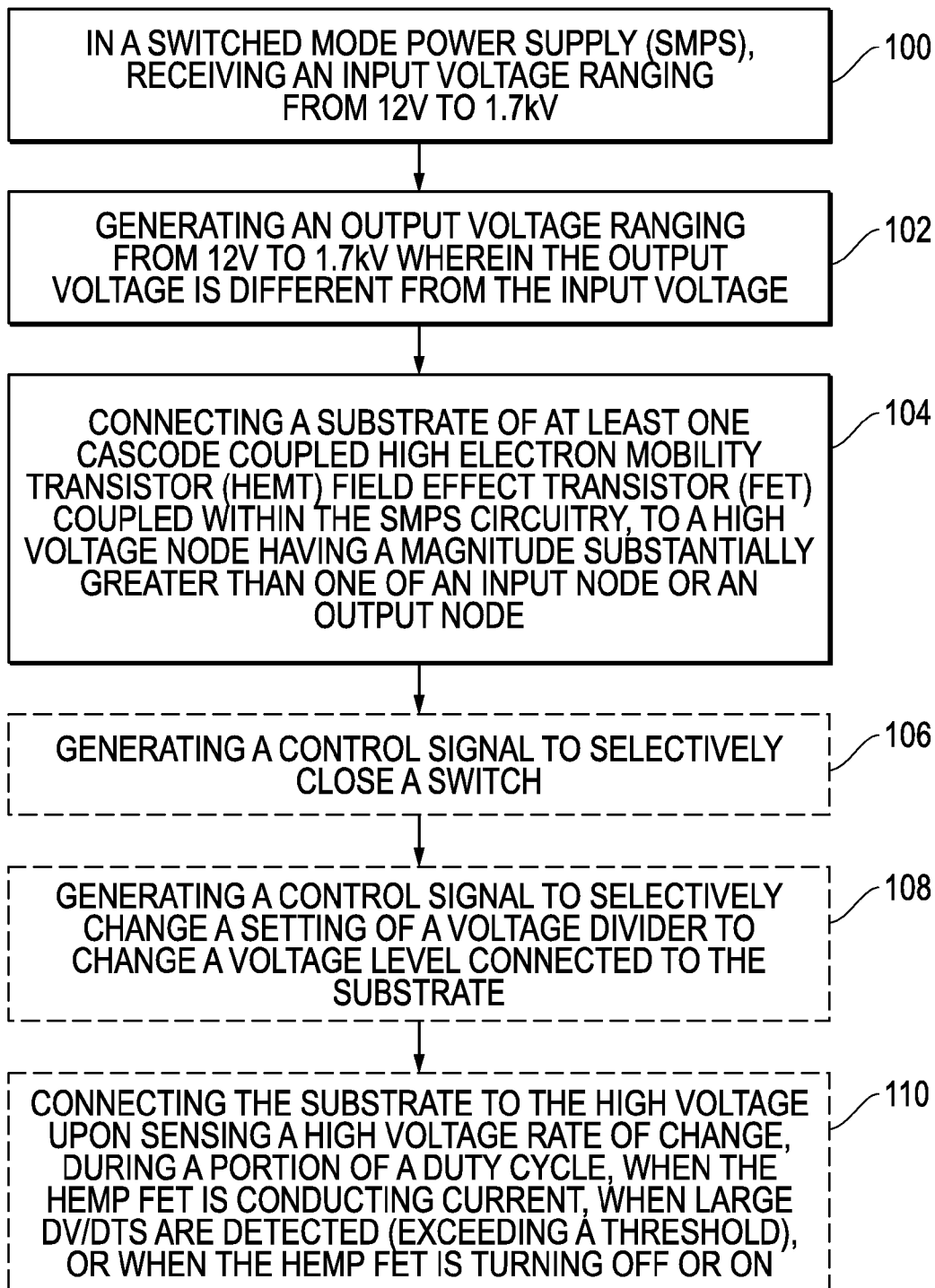
FIG. 5 is a flow chart illustrating a method according to one embodiment.

FIG. 5 is a flow chart illustrating a method according to one embodiment. In a switched mode power supply (SMPS), the method commences with receiving an input voltage ranging from 12V to 1.7 kV (100). This input voltage, for example, may be the input voltage for any of the embodiments of FIGS. 1-4. Thereafter, the method includes generating an output voltage ranging from 12V to 1.7 kV wherein the output voltage is different from the input voltage (102). This output voltage, for example, may be the output voltage for any of the embodiments of FIGS. 1-4. In order the reduce high dv/dt, the method includes connecting a substrate of at least one cascode coupled high electron mobility transistor (HEMT) field effect transistor (FET) coupled within the SMPS circuitry, to a high voltage node having a magnitude substantially greater than one of an input node or an output node (104). In one embodiment, the connection is permanent. In another embodiment, the connection is via at least one of a switch or a voltage divider.

Depending on the configuration of the SMPS system, the method optionally includes generating a control signal to selectively close a switch (106) to connect a substrate to a high voltage node or voltage divider. Alternatively, or additionally, depending on the SMPS configuration, the method can include generating a control signal to selectively change a setting of the voltage divider to change a voltage level connected to the substrate (108). Finally, the method may include connecting the substrate to the high voltage upon sensing a high voltage rate of change, during a portion of a duty cycle, when the HEMT FET is conducting current, when large dv/dts are detected (exceeding a threshold), or when the HEMT FET is turning off or on (110).

The above-disclosed subject matter is to be considered illustrative, and not restrictive, and the appended claims are intended to cover all such modifications, enhancements, and other embodiments that fall within the true scope of the claims. Moreover, while the above embodiments are in relation to an SMPS system, it should be understood that the concepts may be applied with a Boost Converter, a Buck Converter, a Single-Ended Primary-Inductor Converter or other types of converters. The principles and scope are limited to the embodiments shown herein. Moreover, various aspects disclosed herein may be modified and/or combined with other aspects of other embodiments. For example, the voltage divider configuration of FIG. 4 may be combined with any of the aspects disclosed in relation to FIGS. 1-3 including selective biasing, constant biasing (as in FIG. 4), or biasing during a portion of a duty cycle. Moreover, the high voltage node to which a substrate is connected need not be an output node. It may be any node having a high voltage. Thus, for some embodiments, it may be an input node. It may also be a node within the circuit or system that is neither the output or the input nodes.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A switched mode power supply (SMPS) system, comprising:
   a voltage input for receiving an input voltage;
   SMPS circuitry configured to produce a voltage output based on the input voltage, the SMPS circuitry including:
   inductive, capacitive and switching elements configured, with high switching rate of the switching elements, to generate the voltage output;
   the switching elements further including at least one set of cascode coupled devices, each set of the cascode coupled devices including a high electron mobility transistor (HEMT) and one of a diode and a field effect transistor (FET) in a cascode coupling with the HEMT, wherein each HEMT includes a substrate; and
   a controller configured to produce a signal to a gate terminal of at least one of the FET and the HEMT of the sets of cascode coupled devices; and
   circuitry to electrically couple the substrate of at least one HEMT to a high voltage node.

2. The SMPS system of claim 1 wherein the circuitry to couple to the substrate comprises a lead or trace or wire to continuously electrically connect the substrate to a high voltage node or at least one of:
   a switch to selectably electrically connect the substrate the high voltage node; and
   a voltage divider coupled to the high voltage node and configured to electrically connect the substrate to a reduced high voltage.

3. The SMPS system of claim 1 comprising one of a Boost Converter, a Buck Converter, a Single-Ended Primary-Inductor Converter.

4. The SMPS system of claim 1 wherein:
   the input voltage ranges from 12V to 1.7 kV;
   the voltage output ranges from 12V to 1.7 kV; and
   the high voltage node comprises either the input for a step down converter or the output for a step up converter.

5. The SMPS system of claim 1 further comprising at least one voltage divider circuit connected between the high voltage node and at least one HEMT substrate to electrically connect the at least one HEMT FET substrate to a divided voltage that is less than a voltage presented at the high voltage node.

6. The SMPS system of claim 1 further including switching circuitry configured to selectively electrically couple at least one cascode coupled HEMT substrate to the high voltage node.

7. The SMPS system of claim 6 wherein the switching circuitry is coupled to receive a control signal from the controller wherein the controller is operable to selectively electrically connect the at least one cascode coupled HEMT substrate to the high voltage node during a portion of a signal duty cycle.

8. The SMPS system of claim 6 wherein the switching circuitry and the controller are configured to selectively electrically connect the at least one cascode coupled HEMT substrate to the high voltage node only when the cascode coupled HEMT is conducting current.

9. The SMPS system of claim 6 wherein the switching circuitry and controller are configured to selectively electrically connect the at least one cascode coupled HEMT substrate to the high voltage node only when large current or voltage overshoots are detected.

10. The SMPS system of claim 6 wherein the switching circuitry and controller are configured to selectively electrically connect the at least one cascode coupled HEMT substrate to the high voltage node only when a large voltage rate of change (dv/dt) is sensed.

11. The SMPS system of claim 1, the controller is operable to selectively electrically connect the substrate of the cascode coupled HEMT to the high voltage when the HEMT is turning on and to disconnect the HEMT when the HEMT is turning off.

12. A method for generating a high voltage output from a switched mode power supply (SMPS) system, comprising:
receiving at an input node an input voltage ranging from 12V to 1.7 kV;
generating at an output node an output voltage ranging from 12V to 1.7 kV; and
electrically connecting a substrate of at least one cascode coupled high electron mobility transistor (HEMT) connected to the SMPS system, to a high voltage having a magnitude substantially greater than one of said input node or said output node.

13. The method of claim 12 further comprising connecting the substrate to a voltage divider circuit that produces a divided voltage that is less than the high voltage.

14. The method of claim 12 further including selectively electrically connecting the substrate of the at least one cascode coupled HEMT to a high voltage node based upon one of a signal state or a signal portion or based upon whether the HEMT is conducting current.

15. The method of claim 12 further including selectively electrically connecting the substrate of the at least one cascode coupled HEMT to a high voltage node based upon whether large current or voltage overshoots are detected or when a high dv/dt is sensed that exceeds a threshold rate.

16. A switched mode power supply (SMPS) system, comprising:
a direct current (DC) voltage source configured to generate an input voltage for a DC-DC voltage converter; and
the DC-DC voltage converter further comprising:
at least one cascode coupled high electron mobility transistor (HEMT) connected to the SMPS system, wherein the at least one cascode coupled HEMT includes a substrate;
a controller configured to produce an activation signal to at least one gate terminal of the at least cascode coupled HEMT and at least one bias control signal to a switch to selectively electrically connect the at least one HEMT substrate to a high output voltage; and
wherein the controller generates the at least one bias control to electrically connect the substrate of the at least one cascode coupled HEMT to a high output voltage of the SMPS system during at least one of:
a positive portion of a signal duty cycle;
a negative portion of the signal duty cycle;
when the at least one HEMT is conducting current;
when large current or voltage overshoots are detected; and
a high dv/dt is detected.

17. The SMPS system of claim 16 further comprising a voltage divider circuit connected between the output voltage and at least one HEMT substrate to electrically connect the at least one HEMT substrate to a divided voltage that is less that the high voltage output.

18. The SMPS system of claim 16 comprising one of a Boost Converter, a Buck Converter, a Single-Ended Primary-Inductor Converter.

19. The SMPS system of claim 16 wherein the output voltage is a 400 volt output.

20. The SMPS system of claim 16 comprises a DC-DC switched voltage converter.

* * * * *